United States Patent [19]
Mundt

[11] Patent Number: 5,644,400
[45] Date of Patent: Jul. 1, 1997

[54] METHOD AND APPARATUS FOR DETERMINING THE CENTER AND ORIENTATION OF A WAFER-LIKE OBJECT

[75] Inventor: Randall S. Mundt, Pleasanton, Calif.

[73] Assignee: Lam Research Corporation, Fremont, Calif.

[21] Appl. No.: 623,866

[22] Filed: Mar. 29, 1996

[51] Int. Cl.⁶ .................................................. H01L 21/68
[52] U.S. Cl. ......................... 356/400; 356/150; 414/754
[58] Field of Search ............................ 356/399–401, 356/237, 375, 150, 426; 250/548, 491.1, 492.2; 348/94, 95; 33/520, 549, 550, 644; 364/559, 468; 414/754, 757; 355/43, 55

[56] References Cited

U.S. PATENT DOCUMENTS

| | | | |
|---|---|---|---|
| 4,328,553 | 5/1982 | Fredrikson et al. | 364/559 |
| 4,819,167 | 4/1989 | Cheng et al. | 364/167.07 |
| 4,833,790 | 5/1989 | Spencer et al. | 33/520 |
| 4,845,373 | 7/1989 | Jamieson et al. | 356/400 |
| 4,887,904 | 12/1989 | Nakazato et al. | 356/375 |
| 5,194,743 | 3/1993 | Aoyama et al. | 356/400 |
| 5,238,354 | 8/1993 | Volovick | 356/400 |
| 5,258,823 | 11/1993 | Akamatsu | 356/401 |
| 5,264,918 | 11/1993 | Kagami | 356/400 |
| 5,405,230 | 4/1995 | Ono et al. | 356/400 |
| 5,483,138 | 1/1996 | Shmookler et al. | 318/568.16 |

*Primary Examiner*—Hoa Q. Pham
*Attorney, Agent, or Firm*—Burns, Doane, Swecker & Mathis, L.L.P.

[57] ABSTRACT

A device and method for determining the center and orientation of a circular workpiece such as a semiconductor wafer. A beam of light from a light emitting diode is nearly collimated by a collimation lens before being reflected by a conical mirror. After reflecting from the conical mirror, the beam is reflected by a frustoconical mirror down to a flat annular mirror positioned below a semiconductor workpiece. That portion of the beam not intercepted by the workpiece is reflected back to the frustoconical mirror by the flat mirror. The return beam is then reflected by the conical mirror and passes through the collimating lens and forms a ring of light on a quadrature photodiode array. Light striking the quadrature photodiode array is converted into an electrical voltage or signal proportional to the amount of light striking each photodiode. By comparing the signals from each photodiode, the amount of light striking each diode can be compared to determine the position of the center and the orientation of a workpiece.

19 Claims, 5 Drawing Sheets

METHOD AND APPARATUS FOR DETERMINING THE CENTER AND ORIENTATION OF A WAFER-LIKE OBJECT

FIELD OF THE INVENTION

The invention relates to a light detection system for determining information regarding positioning of a wafer-like object.

BACKGROUND OF THE INVENTION

In the processing of semiconductor wafers by plasma etching, chemical vapor deposition, photolithographic etching and other means there is a need to precisely locate and align the wafer. Traditional means used mechanical pins that, through contact with the edge of the wafer; were able to determine the edge and then calculate the wafer's center. The use of pins is not sufficiently accurate for some microelectronic circuitry work. Additionally, the contact from pins has the effect of producing particulates which interfere with processing of the wafer.

A non-contact technique of determining the edge and center of a wafer involves the use of a movable detector including a light source and light detector which are spaced apart to allow a wafer to pass therebetween. Other non-contact techniques include height sensors for determining the location of a wafer flat (see U.S. Pat. No. 4,328,553) or an array of sensors which are located along a path of movement of the wafer (see U.S. Pat. No. 4,819,167). Although these techniques avoid contact of the wafer with pins and thus avoid the problem of generating particulates, they have limitations on accuracy. Additional inaccuracies in the image could result from movement of the light detector or wafer during the measurement process. Such inaccurate position readings could thus produce inaccurate results in the determination of the center and orientation of the semiconductor wafer. Given the increasing need to reduce the size of components in chip manufacture there is an ever increasing need to be able to precisely determine both the center and orientation of semiconductor wafers during processing.

Currently available methods for determining a wafer's center require the use of moving parts to scan, rotate or move contact pins. This increases the cost of the wafer centering device and increases the chances of mechanical failure. It is an object of the present invention to determine whether a wafer is properly centered and orientated without the need for moving parts.

A system for positioning of semiconductor wafers is disclosed in commonly owned U.S. Pat. No. 4,833,790. As shown in FIG. 1, the positioning system includes a wafer shuttle 12, a position sensor 14, a rotatable spindle 16 on a base 17 and a central controller 24 comprising a programmable digital computer. The wafer shuttle 12 retrieves wafers W from a wafer cassette 18 and transports the wafers to the spindle 16 where the wafers are centered and aligned in a desired orientation prior to being removed by an articulated wafer transport arm 20 having a first segment 20a and a cradle segment 20b, both of which are located in an air lock 22 associated with processing equipment such as a plasma etch system, CVD reactor, or the like.

The wafer cassette 18 includes horizontal shelves 19 supporting individual wafers and the cassette is movable vertically by an elevator platform. The wafer shuttle 12 includes a carriage 40 mounted to horizontally reciprocate on a pair of guide rails 42 with the position of the carriage 40 being controlled by an electric drive motor 44 controlled by controller 24 through communication line 46 which passes into interface 26. A I-shaped support arm 50 secured to carriage 40 reciprocates along a linear path between the spindle 16 and the wafer cassette 18 as the carriage 40 is driven back and forth along guide rails 42. The support arm 50 can include vacuum ports for securing the wafer during transport. The arm 50 can be retracted to place a wafer over spindle 16 and spindle 16 can be raised so that the wafer is lifted above the arm 50.

The spindle 16 can include a vacuum port for firmly securing the wafer thereto. When placed on the spindle 16, the center of the wafer will be offset from the center of the spindle by an unknown distance in an unknown direction. The position sensor 14 includes a carriage 60 mounted on a rotating drive screw 62 driven by motor 64 which in turn is supervised by controller 24 through communication line 66. The carriage 60 includes an optical detector 68 and by translating the carriage 60 back and forth, the location of the periphery of the wafer along the linear path between the spindle and the cassette can be determined. The optical sensor 68 can be a light emitting diode source and a phototransistor detector.

The centering operation is described with reference to FIG. 2. In operation, the distance $r_1$, between the center of rotation CR and a point $P_1$, on the periphery of the wafer W, is measured after rotating the wafer through an angle $\Theta_1$ from an arbitrary baseline BL drawn through the center of rotation. The values of the radius $r_1$ and angle $\Theta_1$, are then stored in the controller 24. The wafer is then further rotated through a second angle $\theta_2$ relative to the baseline BL and the distance $r_2$ between the center of rotation CR and a point $P_2$ on the periphery of the wafer W is measured. Similar measurements are then made for a third point $P_3$ and when the measurements are completed, the length of offset l and angular offset $\alpha$ are calculated according to mathematical formulas. Once the offset angle $\alpha$ and offset length l have been determined, the wafer can be rotated by the spindle 16 so that the line between the center of rotation CR and the center of the wafer CW is aligned with the direction of the linear path travelled by the support arm 50. The wafer is then lowered onto the support arm 50 by retracting spindle 16 after which the support arm 50 is translated in the direction necessary to align the center of the wafer CW with the center of rotation CR. The spindle 16 can then be raised and the wafer is ready for further manipulation and processing.

It is an object of the present invention to provide a method and apparatus to precisely locate the center and orientation of a semiconductor wafer in a manner which overcomes limitations of the prior art.

SUMMARY OF THE INVENTION

The invention provides a light detection system for verifying a position of a center and/or discontinuity on an edge of a circular workpiece, comprising a support, light source, collimating lens, first, second and third reflectors, a light detector, and a controller. The circular workpiece is supported such that an outer periphery of the workpiece is located outwardly of the support. The light source faces the first side of the workpiece and projects light toward the workpiece. The collimating lens is between the light source and the workpiece and light from the light source passes through the collimating lens in a direction nonparallel to an optical axis of the lens. The first reflector is between the collimating lens and the workpiece such that the light passing through the collimating lens is reflected radially outwardly by the first reflector. The second reflector faces the outer periphery of the workpiece such that the light reflected by the first reflector is reflected by the second reflector. The third reflector faces the second side of the workpiece and reflects light back towards the second reflector such that the reflected light is reflected by the first reflector through the collimating lens and is focused by the collimating lens at a focal position spaced from the light source. The light detector is spaced from the focal position and receives the reflected light such that the reflected light illuminates a two-dimensional area on the light detector. The controller is electrically connected to the light detector and receives signals outputted from the light detector to verify whether a center of the workpiece is aligned with the optical axis.

The light detection system can be used in conjunction with a transport mechanism engageable with the workpiece and operated by the controller to move the transport mechanism into engagement with the workpiece and move the workpiece to a position at which the center of the workpiece is coincident with the optical axis. The light source can comprise a light emitting diode, the light detector can comprise a photodiode, the first reflector can comprise a conical mirror, the second reflector can comprise a frustoconical mirror and the third reflector can comprise a flat mirror, the collimating lens focusing light from the diode into a ring of light and the controller comparing ratios of two dimensional areas of light intensity on sections of the photodiode formed as a result of the ring of light projecting onto the outer periphery of the workpiece. The light detector can comprise a quadrature photodiode which outputs data to the controller corresponding to measured light intensity in four rectangular sections of the light detector arranged such that the optical axis intersects a corner of each of the four rectangular sections. The support can be fixedly mounted so as to be immovable with respect to the light source and light detector. The light source preferably projects the ring of light such that the ring of light is coincident with the optical axis and the light source comprises a light emitting diode.

The invention also provides a method of detecting a center of a circular workpiece, comprising steps of locating a circular workpiece on a support such that an outer periphery of the workpiece is located outwardly of the support, the support cooperating with a light source facing a first side of the workpiece and a light reflector facing a second side of the workpiece; projecting light from the light source through a collimating lens such that a ring of light nonparallel to an optical axis of the collimating lens intersects the outer periphery of the workpiece and a portion of the ring of light not intersected by the outer periphery of the workpiece is received by a light detector; outputting signals from the light detector to a controller and recording data corresponding to a location of a reflected portion of the ring of light on the light detector; and determining whether a position of a center of the workpiece is aligned with the optical axis of the collimating lens.

The support can comprise a rotatable spindle rotated by a motor electrically connected to the controller, the controller receiving signals outputted from the motor so as to record angular positions of the spindle. Alternatively, the support can comprise a transport mechanism and the method can further comprise moving the transport mechanism to a position at which the center of the wafer is coincident with the optical axis. The light detector can comprise a quadrature photodiode and the collimating lens can focus the reflected portion of the ring of light such that each section of the light detector receives a segment of the reflected portion of the ring of light. The signals can be continuously outputted from the light detector and data corresponding to the reflected portion of the ring of light received by the light detector can be recorded during revolution of the workpiece. The workpiece can comprise a semiconductor wafer having a discontinuity on the outer periphery thereof and the method can further comprise a step of determining the location of the discontinuity. The location of a discontinuity on the edge of the workpiece can be determined by comparing ratios of signals outputted by the light detector. Further, the location of the center of the workpiece can be determined by comparing ratios of signals outputted by the light detector.

DETAILED DESCRIPTION OF THE PREFERRED EMBODIMENTS

Figure 1:
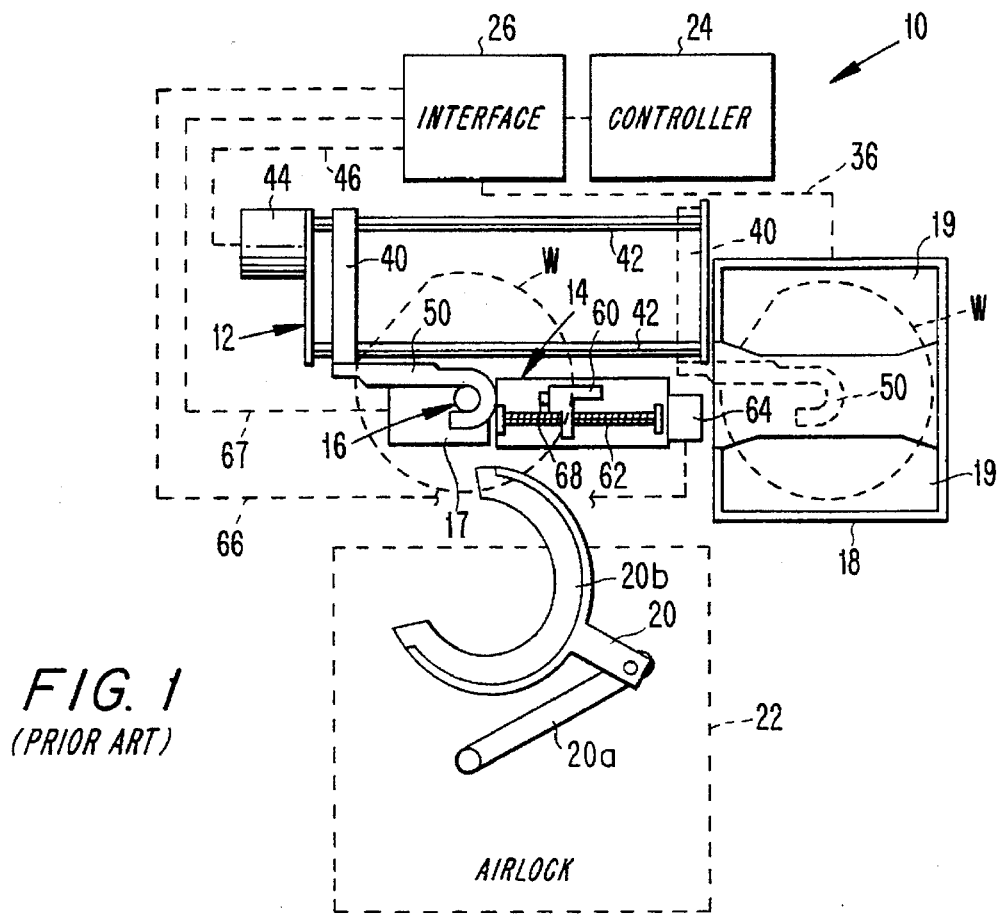
FIG. 1 shows a prior art positioning system.

The following description relates to a system and method for determining whether a circular workpiece such as semiconductor wafer is properly centered. Although the description is directed specifically toward semiconductor wafers, it will be appreciated that the principles of the invention apply equally well to centering and orienting other circular objects such as recording disks, magnetic media disks, circular bioassay plates, and the like.

Determining whether a semiconductor wafer is properly centered and oriented is a necessary part of many manufacturing processes in the production of semiconductor chips and devices. In the case of a silicon wafer, the crystalline form of silicon used in semiconductor devices has a specific orientation which may affect the performance of devices made from the semiconductor wafer.

According to one embodiment of the invention, a light detection system for determining whether a circular workpiece is properly centered and/or oriented, comprises a light emitting diode, a collimating lens, a conical mirror, a frustoconical mirror, a flat annular mirror, and a quadrature photodiode array and a controller. The light emitting diode (LED) is positioned inside or beyond the focal length and on the optical axis of the collimating lens. The optical axes of the collimating lens, conical mirror and frustoconical mirror are all aligned at the nominal center of a circular workpiece and the lens and mirrors are positioned above the circular workpiece. The flat annular mirror is positioned below the circular workpiece so as to reflect back to the collimating lens light from the LED not intercepted by the workpiece. Light from the LED reaches the flat annular lens and workpiece, and is reflected back through the collimating lens to the photodiode array, by way of the conical mirror and frustoconical mirror which reflect light between the flat annular mirror and collimating lens. Due to the offset of the LED from the focal point of the collimating lens, the light not intercepted by the workpiece and reflected from the flat annular mirror returns on a sightly different optical path than the light from the LED to the flat annular mirror. By returning on a slightly different optical path the light is directed by the collimating lens into the quadrature photodiode array rather than the LED.

The quadrature photodiode array includes four photodiodes arranged in a rectangular pattern which intercepts the returning light. Each of the photodiodes outputs an electrical signal in proportion to the amount of light striking it. The system is calibrated by adjusting the signals from each of the photodiodes to be equal, such as by mechanical or electronic adjustment, when a circular workpiece is properly centered within the device. Once calibrated, different combinations of the ratios of signals from the photodiodes provides a measurement of the displacement of the center of the workpiece from the nominal center of the system as well as the rotational misalignment of a workpiece having an orientational notch or flat.

Figure 3:
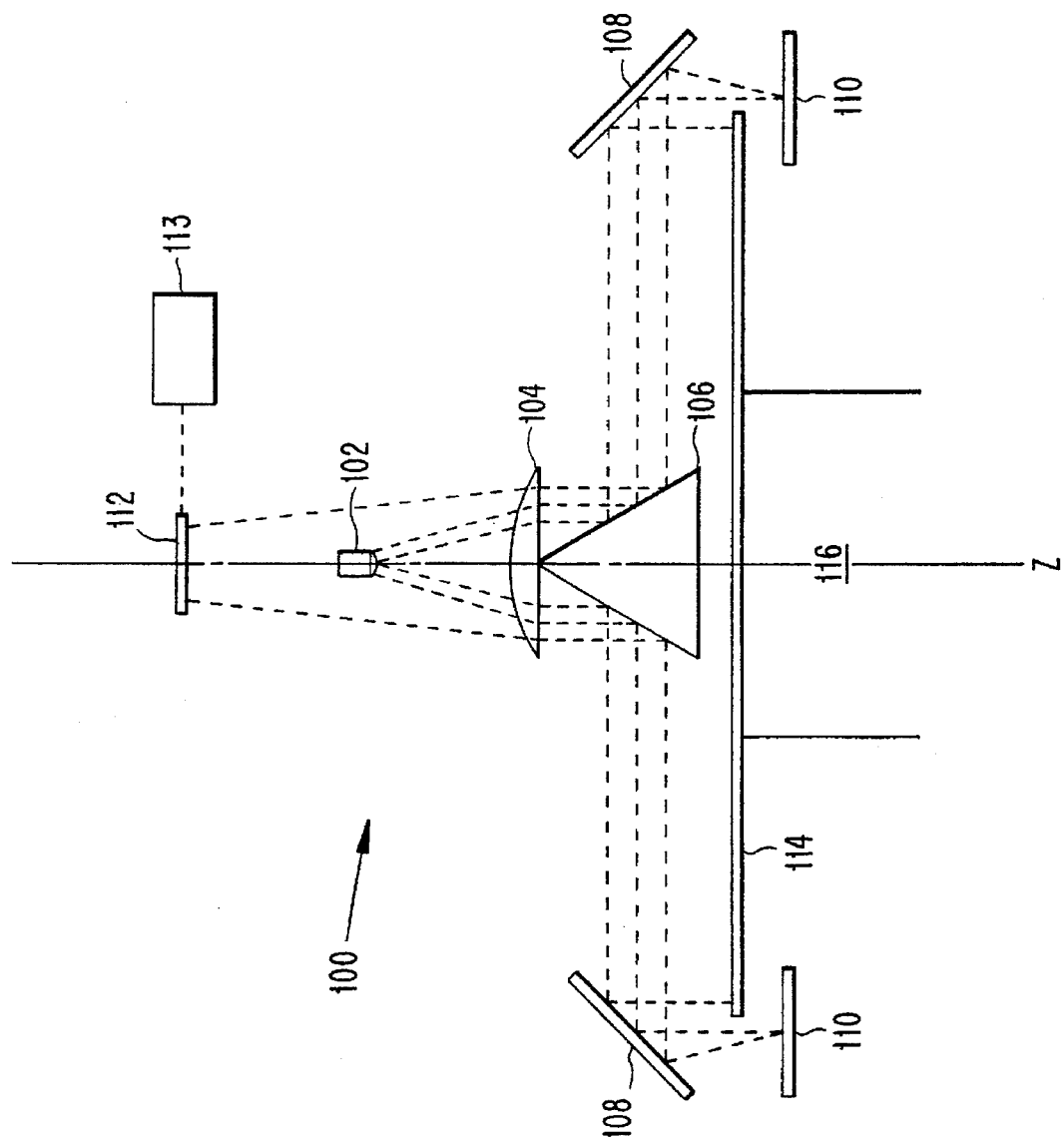
FIG. 3 shows a positioning system in accordance with one embodiment of the invention.

As shown in FIG. 3, a light detection system 100 in accordance with the invention includes a semiconductor wafer handling device (not shown), a light emitting diode (LED) 102, a collimating lens 104, a conical mirror 106, a frustoconical mirror 108, a flat annular mirror 110, a quadrature photodiode array 112 and controller 113. The light emitting diode 102 is located within the focal point of the collimating lens 104 and along the optical axis Z of the collimating lens 104. The position of the LED 102 is adjustable to allow for proper adjustment of the divergence of the beam after passing through the collimating lens 104. The optical axis of the LED 102 and the central axes of the collimating lens 104, conical mirror 106, and frustoconical mirror 108 are coincident and positioned to fall at the nominal wafer center. The nominal wafer center is that point where the center of a wafer would be if a wafer were properly centered within the device.

In the embodiment shown in FIG. 3, if it is desired to center a circular wafer of 8 inch diameter, the conical mirror 106 can be 1 inch in length along the optical axis Z and 2 inches in diameter at its circular base. The collimating lens 104 is located just above the conical mirror 106 and can have a 2 inch diameter and a focal length of 4 inches. The light emitting diode 102 can be located 2.86 inches above the circular base of the lens and can project onto the collimating lens 104 a circular light beam of 1 inch in diameter. The quadrature photodiode array 112 can be located 2.14 inches above the light emitting diode and the array can occupy an area of approximately 0.25 square inches. The frustoconical mirror 108 can have a mean radius of 8 inches, the same radius as the wafer 114, and a mirrored surface sloped at a 45 degree angle to match a 45 degree angle of the mirrored surface of the conical mirror 106. The flat annular mirror 110 can be located 1 inch below the wafer 114.

The operation of the wafer centering device is as follows. A wafer 114 to be centered is placed on a support 116 such that the center of the wafer is near the nominal center of the wafer centering device. The light emitting diode 102 projects a beam of light in the direction of the collimating lens 104. After the beam of light passes through the collimating lens 104 it is very nearly, but not quite collimated. The position of the light emitting diode 102 is adjustable to control the divergence of the beam after passing through the collimating lens. The degree of divergence of the beam is desirable for optimum operation of the wafer centering device as will be described below.

After passing through the lens 104, the nearly collimated beam then strikes the conical mirror 106 and is reflected radially outwardly from the optical axis of the conical mirror 106 and collimating lens 104 at an angle of approximately 90 degrees.

The radially reflected beam then strikes the frustoconical mirror 108 of mean diameter equal to the diameter of the wafer. The frustoconical mirror is oriented to reflect the radially reflected beam at approximately 90 degrees toward the surface of the wafer 114 located on the support 116. For centering and aligning an 8 inch wafer, the outside diameter of the ring of light projected down onto the wafer 114 and flat annular mirror 110 can be greater than 8 inches.

A portion of the beam is intercepted by the wafer while another portion of the beam passes by the wafer and strikes the flat annular mirror 110 which is positioned such that the wafer is between the frustoconical mirror 108 and annular mirror 110. The portion of the beam striking the flat annular mirror 110 is reflected at an angle of approximately 180 degrees back toward the frustoconical mirror 108. Due to the divergence of the beam stemming from the fact that the light from the LED 102 was not perfectly collimated by the collimating lens 104, the reflected light returning from the flat annular mirror 110 will not follow the exact same path as the incoming light from the frustoconical mirror 108. The portion of light reflected from the flat annular mirror 110 forms a return beam which strikes the annular frustoconical mirror 108 and is reflected at an angle of approximately 90 degrees back toward the conical mirror 106.

Figure 4:
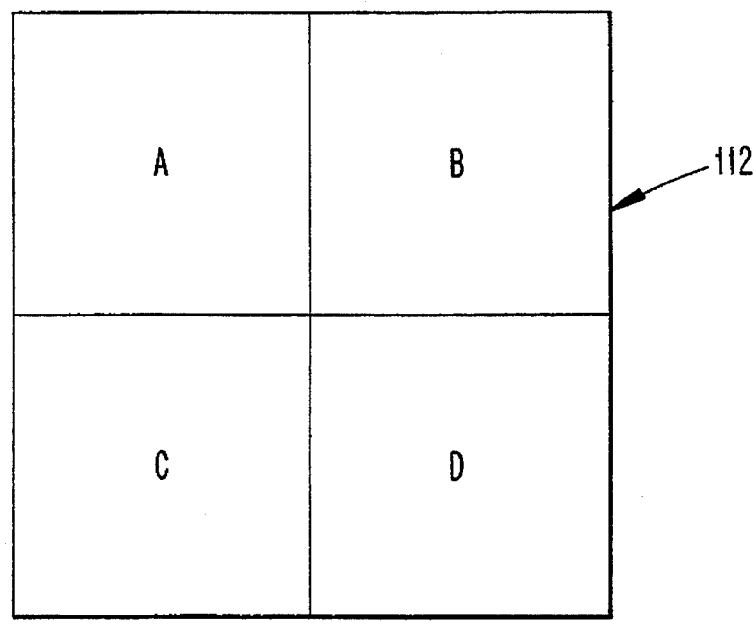
FIG. 4 shows a quadrature photodiode array in accordance with the invention.

After striking the conical mirror 106 the return beam is reflected at an angle of approximately 90 degrees toward the collimating lens 104. After passing through the collimating lens 104, the portion of light reflected back from the flat annular mirror 110 strikes the quadrature photodiode array 112. The quadrature diode array 112 includes four photosensitive diodes arranged in a four sector arrangement as shown in FIG. 4.

While the present embodiment described below uses a quadrature photodiode array, other embodiments of the invention could use photodiodes arranged in patterns other than a rectangular grid of four photodiodes. For instance, the photosensor 112 could include two or three diodes or a plurality of diodes arranged in patterns such as a ring of diodes or a rectangular array of more than four diodes. Such arrangements can be located at positions which intercept a sufficient portion of the returning beam to provide enough information to determine if the wafer is properly centered. In the present invention, the quadrature photodiode array advantageously simplifies signal processing by allowing analog signals to be used in simple algorithmic calculations which compare ratios of outputted data from the four diode array.

Figure 5:
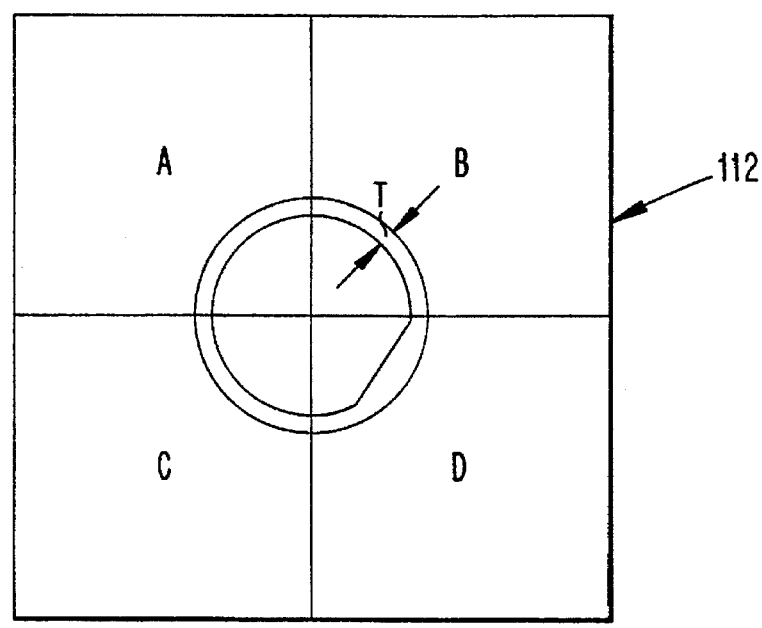
FIG. 5 shows the image formed on the quadrature photodiode array by the returning beam of light not intercepted by the wafer to be centered in accordance with the present invention.

The returning beam of light which strikes the quadrature photodiode array forms a ring of light as shown in FIG. 5. Depending on the position of the wafer, the proportions of the ring segments in each of the four photodiodes correspond to the position of the wafer within the centering device. As can be seen from FIG. 5, the thickness T of the ring of light is broader in some directions than in others due to the displacement of the wafer from the nominal wafer center. By returning that portion of the light not intercepted by the edge of the wafer back through the collimating lens, the full 360 degree image of the wafer's edge is projected onto a single photosensor. This reduces complexity of aligning mirrors and lenses to focus light on multiple detectors and eliminates the need to move either the detector or the wafer to measure the full 360 degree edge of the wafer.

Light that strikes each sector of the quadrature photodiode array 112 is converted to a separate electrical voltage or signal. These electric signals are then compared to determine the position of the center of the wafer relative to the calibrated nominal center of the wafer and/or the orientation of the wafer can be determined. As shown in FIG. 4, the photosensor includes four sectors corresponding to signals A, B, C, and D.

To compare the four signals the system is calibrated by having a wafer placed on the support 116 such that the center of the wafer is aligned with a reference point such as the optical axis of the wafer centering device. The output signals A-D from the sectors are then made equal by either mechanical or electrical adjustments. As the alignment of the LED, lens and mirrors may not be perfect, the calibration of the quadrature photodiode array's output signal can take into account minor alignment imperfections, non-circular wafer shapes and/or nominal wafer center positions producing a ring of light with a nonuniform thickness T at all points around the ring.

Once the centering device is calibrated, a wafer in the device is centered when the signal from each quadrant is equal. For the orientation shown in FIG. 4, the ratio of signals $Y=(A+B)/(C+D)$ is a measure of the displacement of the wafer center compared to the nominal center in the vertical direction and $X=(A+C)/(B+D)$ is a measure of displacement in the horizontal direction. The use of four photodiodes as shown in FIG. 4 allows the device to accurately determine whether a wafer is properly centered. When the ratio of signals for the vertical direction and the ratio of signals for the horizontal direction are both equal to unity, the wafer is properly centered on the support. Minor variations in the diameter of the wafer or position of the wafer along the optical axis Z will not affect the determination of the wafer position since the ratio of signals from the sectors is used rather than the absolute magnitude of the signals.

One advantage of the present method of determining the center position of a circular work piece such as a semiconductor wafer is the simplicity of the algorithm for determining the displacement of the wafer center from the optical axis. This reduces the number of computing steps and consequently allows a faster determination of the wafer's center. The analog nature of the signal processing of the present invention significantly reduces the computational burden of the system by eliminating analog to digital conversion and numerical processing steps. Further, while photodiode arrays with greater than four photodiodes could be used where greater centering accuracy is desired, the additional complexity created by the larger number of variables increases the computational burden.

According to the invention, it is possible to determine the center via a static system with no moving parts, i.e., without the need to rotate or scan the wafer. As such, the cost of the system is greatly reduced compared to dynamic systems utilizing moving components. As the wafer does not need to be moved or rotated to determine the center, the actual real time acquisition and processing the signals from the quadrature diode array is significantly reduced. Wafer center information can be produced in milliseconds allowing for "on the fly" sensing and correction of wafer centering and orientation.

Without moving parts to rotate or scan the wafer, the present invention allows application in locations previously difficult or impossible for other centering systems. This makes the present invention particularly adaptable to high temperature and vacuum environments. Further, due to the absence of moving parts, generation of undesirable particles can be minimized, a feature highly advantageous in the clean environments required for semiconductor processing. The present invention is also particularly adaptable to centering wafers while they are being transported between processing or storage stations. Due to the lack of complexity associated with moving parts, the present invention can be incorporated into a transport mechanism such as a robotic arm or tray that shuttles wafers between stations. Additionally, centering of wafers can be accomplished within a wafer processing or storage machine according to the present invention due to its simplicity and lack of moving parts.

Figure 2:
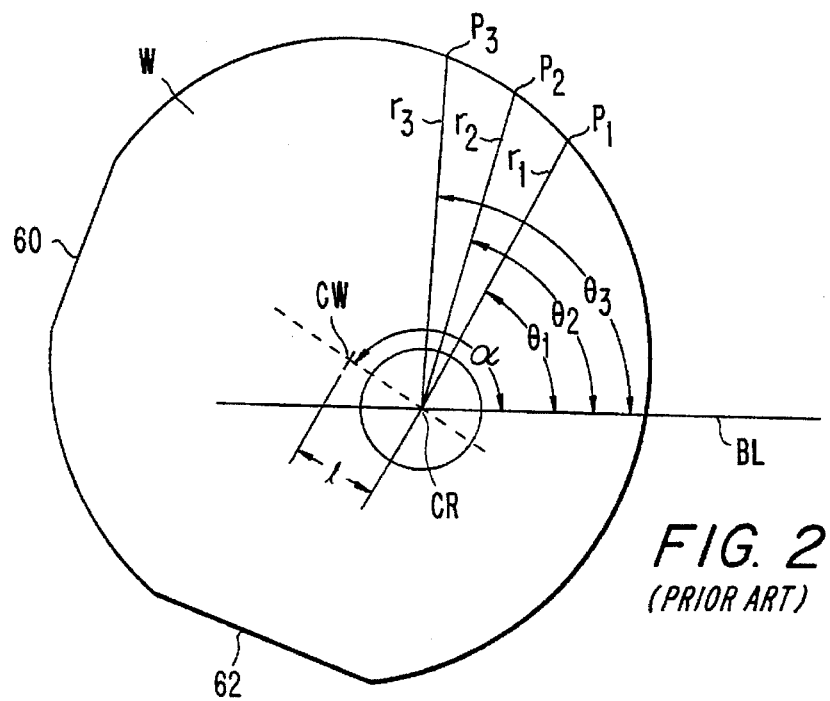
FIG. 2 shows an example of a silicon wafer with two flats and illustrates how measurements are made with the positioning system of FIG. 1.

As shown in FIG. 2, a semiconductor wafer W can have one or more flats 60,62 or notches (not shown) forming one or more discontinuities in the outer edge of the wafer. The discontinuity can be used to indicate the orientation of the crystalline lattice structure of the semiconductor wafer W. Once the orientation of the wafer's crystalline lattice structure is known, the wafer can be rotated to a desired crystal orientation for further processing of the wafer into semiconductor chips and devices.

In the embodiment of the invention shown in FIG. 3, the semiconductor wafer 114 to be centered and aligned can be placed on a stationary, rotatable or movable support 116 by a suitable wafer transport mechanism such as that disclosed in commonly owned U.S. Pat. No. 4,833,790 or any other suitable apparatus such as a robotic arm movable to desired x-y or x-y-z positions.

According to the invention, the location of a discontinuity on a circular workpiece can be determined by comparing the signals from each of the sectors of the quadrature photodiode array 112. If the calibration is done so that a wafer with a flat side, as shown in FIG. 2, has its flat side falling in sectors corresponding to signals C and D, then the ratio of signals $R=(A+D)/(B+C)$ provides a measurement of the rotational alignment or misalignment of the wafer from the calibrated position (e.g., when R=1, the flat is positioned at a desired angular orientation). By having four photodiodes arranged in a rectangular grid pattern as depicted in FIG. 4, it is possible to determine whether the wafer is properly centered with respect to the nominal center and whether the wafer is properly aligned with respect to its angular position about the optical axis. When a discontinuity such as a flat or notch is entirely within one quadrant of the quadrature photodiode array, signalling information can determine which quadrant the flat or notch of the wafer is in but not the precise position of the discontinuity. This information will allow for a indication of which way the wafer should be rotated to be properly orientated but may not give enough information to determine the precise number of degrees of rotation to reach the desired orientation. Thus, to reach the desired orientation successive wafer rotations and determinations of orientation may need to be performed.

When a determination is made by the system that a discontinuity is not at the desired orientation, proper alignment of the discontinuity can be achieved by rotating the wafer 114 until the rotational ratio R is equal to the calibrated value. In one possible embodiment, the wafer to be aligned can be rotated by a separate movable arm when the centering and alignment device indicates that the wafer is not properly aligned on the support 116 of FIG. 3. Another possible embodiment could use a rotatable spindle as the support 116 where the wafer is rotated to a new position based on the information from the centering and alignment device when the wafer is not properly aligned.

As explained above, the image projected onto the quadrature photodiode array 112 is formed from the projection of the light from the LED 102 onto the wafer 114 by collimating and reflecting the light with the aid of mirrors and a lens. As the semiconductor wafer 114 blocks or reflects part of the beam of light from reaching the flat annular mirror 110, the part of the beam of light not blocked by the semiconductor wafer 114 forms a ring of light on the quadrature photodiode array 112 by the mirrors and lens. The proportions of the ring depend upon the position of the wafer to be centered and output signals generated by the sectors of the quadrature photodiode array correspond to the amount of light striking each sector. The sizes of the conical mirror 106, frustoconical mirror 108, flat annular mirror 110, and collimating lens 104 are related to the size of the wafer to be centered. The size of the beam projected onto the quadrature photodiode array 112 and the size of the quadrature photodiode array 112 should each be large enough to allow for a signal to be produced by at least three diodes when the wafer is off center by the greatest expected amount. This allows for the X, Y centering ratios to be finite in all cases.

In the foregoing embodiment, the light source is located within the focal point of the collimating lens. Alternatively, due to symmetry of the light detection system, the light sensor 112 can be within the focal point of lens 104 and the light emitting diode 102 can be located beyond the focal point of the collimating lens 104 and along the optical axis Z of the collimating lens 104. In contrast to the first embodiment, the position of the LED 102 beyond the focal point provides a convergent beam of light passing out of the collimating lens 104. Since the optical axis of the LED 102 and the central axes of the collimating lens 104, conical mirror 106, and frustoconical mirror 108 are coincident and positioned to fall at the nominal wafer center, the ring of light reflected by mirror 108 intersects the outer periphery of the wafer after being reflected from the flat mirror 110.

Figure 6:
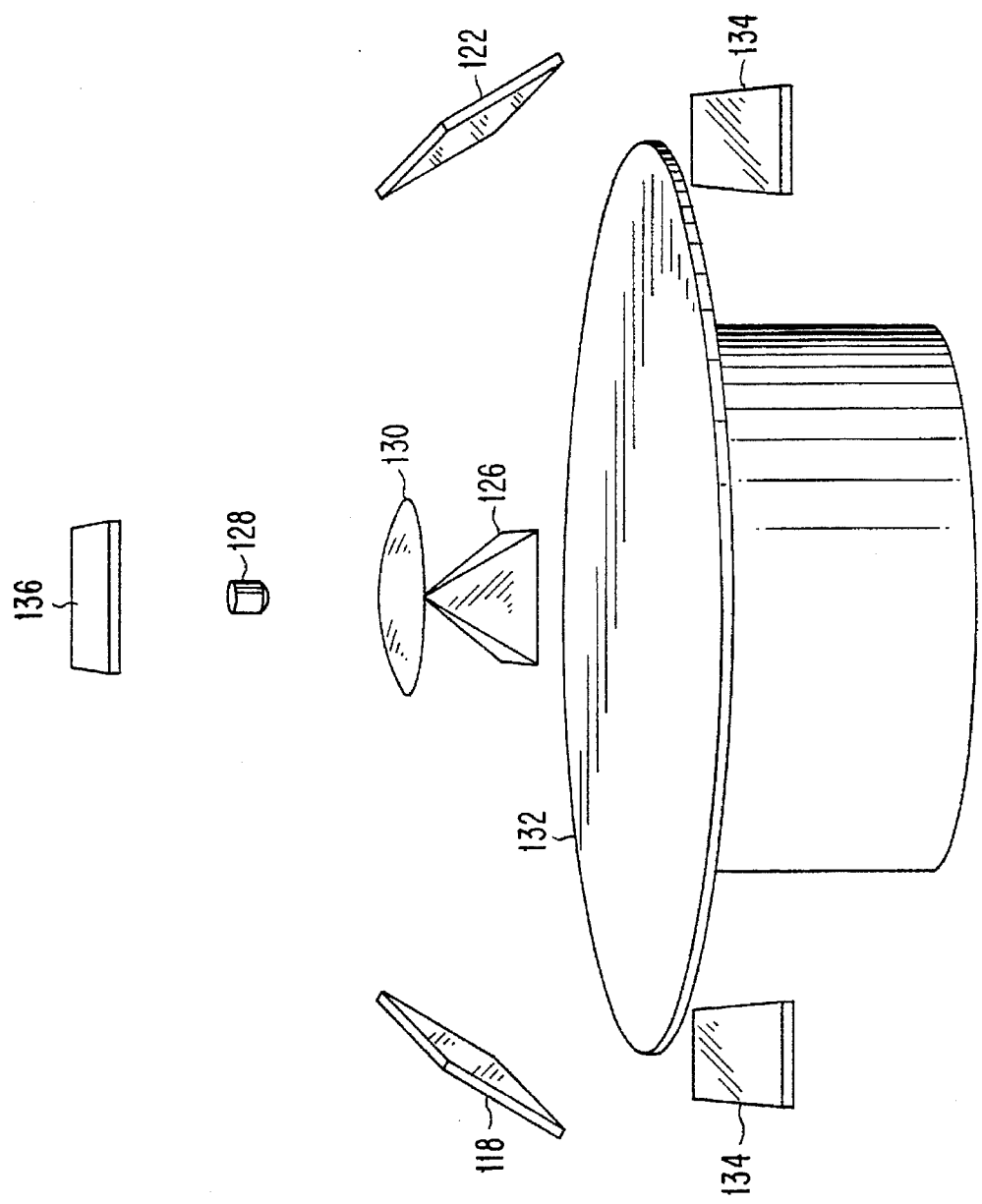
FIG. 6 shows a positioning system in accordance with another embodiment of the invention.

While the foregoing embodiments use a conical mirror 106, a frustoconical mirror 108, and a flat annular mirror 110 to form a image from the return beam representing a 360 degree image of the wafer's edge to indicate the wafer's displacement from center, other embodiments could use a different combination of lenses to form an image from the return beam representing less than 360 degrees of the wafer's edge. As shown in FIG. 6, an alternative embodiment uses a plurality of flat mirrors 118,122 in place of the frustoconical mirror and the conical mirror is replaced by a pyramid shaped mirror 126. Light from the LED 128 passes through the collimating lens 130 and is reflected by the pyramid shaped mirror 126 at an angle of approximately 90 degrees. After being reflected from the pyramid shaped mirror, the light reflects off the flat mirror 118 at an angle of approximately 90 degrees. That portion of the beam of light not intercepted by the wafer 132 is reflected by the flat mirror 134, located opposite the wafer from the flat mirror 118, back to the flat mirror 118 at an angle of approximately 180 degrees. The light not intercepted by the wafer is projected onto the quadrature photodiode array 136 by the collimating lens 130 after being reflected by the pyramid shaped mirror 126 at an angle of approximately 90 degrees.

The embodiments of the present invention described herein merely represent a small number of the possible configurations in which a wafer can be properly centered and aligned by using a light source coupled with mirrors and lenses to return to one detector the image of the wafer's edge and thereby eliminate the need for multiple detectors and moving either the wafer or the measuring device. Still other embodiments of the present invention could use other shapes of mirrors and photodiode arrays to center a wafer according to the present invention. While an image representing 360 degrees of the wafer's edge gives the most information about the wafer, other embodiments could center a wafer within acceptable tolerances with images that do not represent the full 360 degrees of the wafer's edge. While the embodiments described use mirrors to reflect the beam of light at an angle of 90 degrees, other embodiments could align and position the mirrors in such a way that the beam is reflected at other angles.

As the light from the LED 128 is not perfectly collimated due to the LED 128 being located slightly inside the focal length of the collimating lens 130, the return beam from the flat mirror 134 follows a slightly different path. When the return beam is reflected by the flat mirror 118 to the pyramid shaped mirror 126 and by the pyramid shaped mirror 126 to the collimating lens 130, the return beam is projected onto the quadrature photodiode array 136. The image of light formed on the photodiode array by the return beam would not form a ring of light in this embodiment. Instead, four two-dimensional areas of light would be formed on the photosensor. As in the previous embodiment, signals from the quadrature photodiode array could be mechanically or electrically adjusted during calibration to give equal output signals from each photodiode when a wafer is properly centered.

The present invention has several significant advantages over currently available wafer centering devices and methods. Unlike other wafer centering systems the present invention does not require any moving parts to determine whether the wafer is properly centered and aligned. This reduces the cost and complexity of the wafer centering device. Additionally, by eliminating moving parts, the reliability of the device is significantly increased. Another advantage of the present invention is its use of readily available components. Devices such as LED's, photodiodes, collimating mirrors, flat mirrors, circular mirrors are all readily available.

Figure 7:
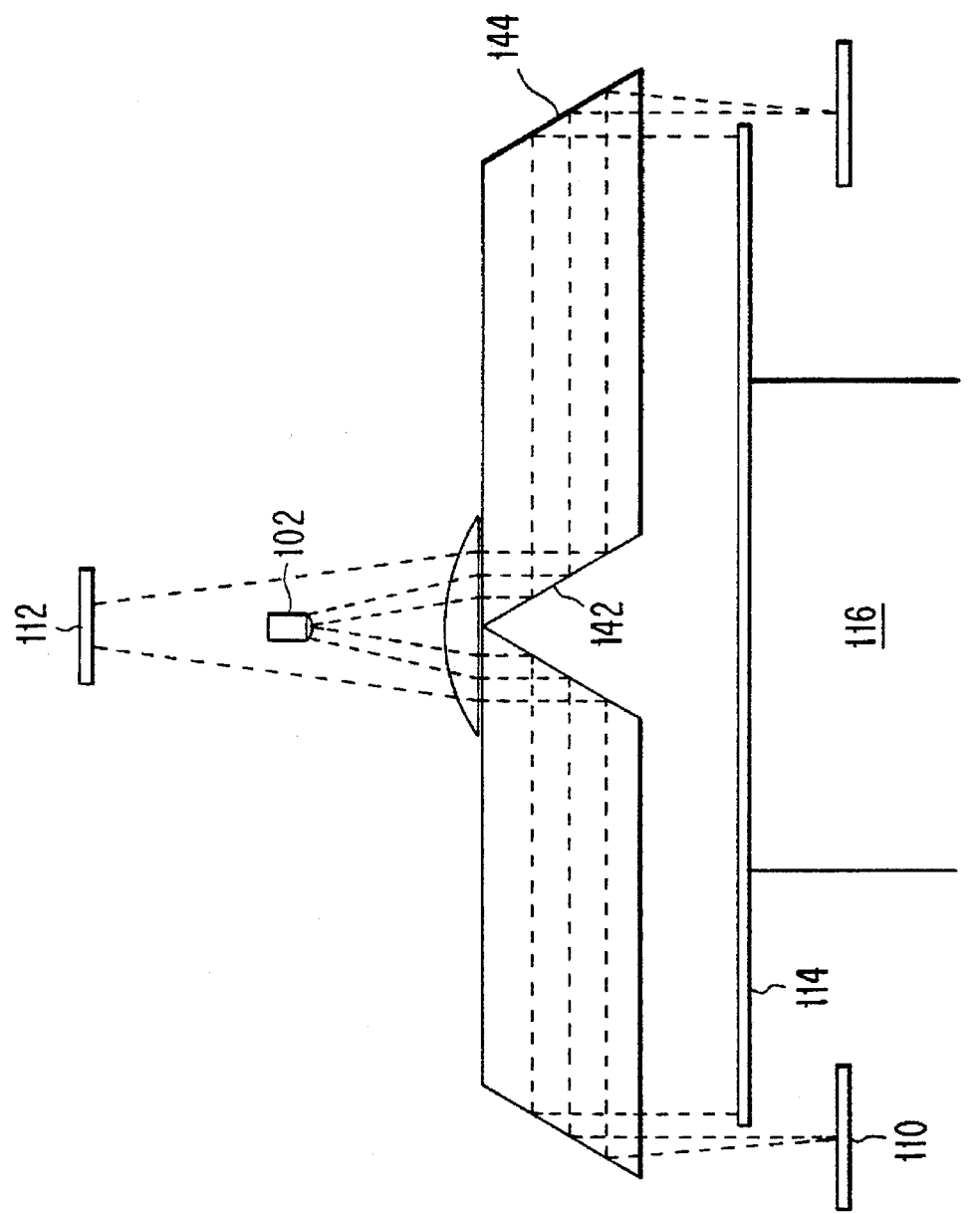
FIG. 7 shows a modification of the embodiment of the position system of FIG. 3 wherein the conical mirror and frustoconical mirror are formed from a single piece of glass.

In an alternative embodiment of the present invention, the circular mirror 106 and frustoconical mirror 108 of FIG. 3 can be formed from a single piece of flat glass by cutting the glass as shown in FIG. 7 where the edge of the glass 142 is formed by cutting a cone shaped hole in the center of the glass to form the conical mirror. The outer edge of the glass 144 is cut at an angle around the circumference of the mirror to form the frustoconical mirror. Both edges 142 and 144 are metallized to provide a reflective surface to deflect a beam of light. While this embodiment uses glass in the creation of the mirrors, any material with the proper optical properties could be used.

It will be appreciated by those of ordinary skill in the art that the present invention can be embodied in other specific forms without departing from the spirit or essential characteristics thereof. The presently disclosed embodiments are considered in all respects to be illustrative and not restrictive. The scope of the invention is indicated by the appended claims rather than the foregoing description, and all changes that come within the meaning and range of equivalence thereof are intended to be embraced therein.

What is claimed is:

1. A light detection system for verifying a position of a center and/or discontinuity on an edge of a circular workpiece, comprising:

a support supporting a circular workpiece such that an outer periphery of the workpiece is located radially outwardly of the support;

a light source facing a first side of the workpiece, the light source projecting light toward the workpiece;

a collimating lens between the light source and the workpiece, the collimating lens having an optical axis and the light from the light source passing through the collimating lens in a direction nonparallel to the optical axis;

a first reflector between the collimating lens and the workpiece, the light passing through the collimating lens being reflected radially outwardly by the first reflector;

a second reflector facing the outer periphery of the workpiece, the light reflected by the first reflector being reflected by the second reflector past the outer periphery of the workpiece;

a third reflector facing a second side of the workpiece and reflecting light back towards the second reflector such that the reflected light is reflected by the first reflector through the collimating lens and focused by the collimating lens at a focal position spaced from the light source;

a light detector spaced from the focal position, the light detector receiving the reflected light such that the reflected light illuminates a two-dimensional area on the light detector; and a controller electrically connected to the light detector, the controller receiving signals outputted from the light detector and being operable to verify whether a center of the workpiece is aligned with the optical axis.

2. The light detection system of claim 1, further comprising a transport mechanism engageable with the workpiece, the controller being operable to move the transport mechanism into engagement with the workpiece and move the workpiece to a position at which the center of the workpiece is coincident with the optical axis.

3. The light detection system of claim 1, wherein the light source comprises a light emitting diode, the light detector comprises a photodiode, the first reflector comprises a conical mirror, the second reflector comprises a frustoconical mirror and the third reflector comprises a flat mirror, the collimating lens focusing light from the light emitting diode into a ring of light and the controller comparing ratios of two dimensional areas of light intensity on sections of the photodiode formed as a result of the ring of light projecting onto the outer periphery of the workpiece.

4. The light detection system of claim 1, wherein the light detector comprises a quadrature photodiode which outputs data to the controller corresponding to measured light intensity in four rectangular sections of the light detector arranged such that the optical axis intersects a corner of each of the four rectangular sections.

5. The light detection system of claim 1, wherein the support is fixedly mounted so as to be immovable with respect to the light source and light detector.

6. The light detection system of claim 1, wherein the light source projects a ring of light such that the ring of light is coincident with the optical axis.

7. The light detection system of claim 1, wherein the light source comprises a light emitting diode.

8. The light detection system of claim 1, further comprising a workpiece transporting mechanism having an arm movable towards and away from the support, the support comprising a movable spindle, the arm of the workpiece transporting mechanism being movable to a position beneath the workpiece and engaging the workpiece by moving the spindle and lowering the workpiece onto the arm of the workpiece transporting mechanism.

9. The light detection system of claim 8, wherein the workpiece is a semiconductor wafer having a discontinuity along the outer periphery thereof, the controller being operable to determine a location of the discontinuity with respect to an angular orientation of the wafer and control rotation of the spindle to position the discontinuity at a desired angular orientation.

10. A method of detecting a center of a circular workpiece, comprising steps of:

locating a circular workpiece on a support such that an outer periphery of the workpiece is located radially outwardly of the support, the support cooperating with a light source facing a first side of the workpiece and a light reflector facing a second side of the workpiece;

projecting light from the light source through a collimating lens such that a ring of light nonparallel to an optical axis of the collimating lens intersects the outer periphery of the workpiece and a portion of the ring of light not intersected by the outer periphery of the workpiece is reflected by the light reflector and received by a light detector;

outputting signals from the light detector to a controller and recording data corresponding to intensity of a two-dimensional area formed by the ring of light on the light detector; and determining whether a position of a center of the workpiece is aligned with the optical axis of the collimating lens.

11. The method of claim 10, wherein the support comprises a rotatable spindle rotated by a motor electrically connected to the controller, the controller receiving signals outputted from the motor so as to record angular positions of the spindle.

12. The method of claim 10, wherein the support comprises a transport mechanism, the method further comprising moving the transport mechanism to a position at which the center of the wafer is coincident with the optical axis.

13. The method of claim 10, wherein the light detector comprises a quadrature photodiode, the collimating lens focusing the reflected portion of the ring of light such that each section of the light detector receives a segment of the reflected portion of the ring of light.

14. The method of claim 10, wherein the signals are continuously outputted from the light detector and data corresponding to the reflected portion of the ring of light received by the light detector are recorded during revolution of the workpiece.

15. The method of claim 10, wherein the support is fixedly mounted with respect to the light source such that the light source and support remain in the same positions while the signals corresponding to the reflected portion of the ring of light are outputted by the light detector.

16. The method of claim 10, wherein the light source projects the ring of light such that the ring of light is coaxial with the optical axis.

17. The method of claim 10, wherein the workpiece comprises a semiconductor wafer having a discontinuity on the outer periphery thereof, the method further comprising a step of determining a location of the discontinuity.

18. The method of claim 10, wherein a location of a discontinuity on an edge of the workpiece is determined by comparing ratios of signals outputted by the light detector.

19. The method of claim 10, wherein a location of the center of the workpiece is determined by comparing ratios of signals outputted by the light detector.

* * * * *